(12) United States Patent
Wen et al.

(10) Patent No.: US 11,221,239 B2
(45) Date of Patent: Jan. 11, 2022

(54) SUBSTRATE PROCESSING APPARATUS AND METHOD OF DETECTING INDENTATION FORMED IN SUBSTRATE

(71) Applicant: Ebara Corporation, Tokyo (JP)

(72) Inventors: Zhongxin Wen, Tokyo (JP); Nobuyuki Takahashi, Tokyo (JP); Suguru Sakugawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 746 days.

(21) Appl. No.: 16/037,085

(22) Filed: Jul. 17, 2018

(65) Prior Publication Data
US 2019/0025096 A1    Jan. 24, 2019

(51) Int. Cl.
| | | |
|---|---|---|
| *G01D 5/46* | (2006.01) | |
| *B24B 37/005* | (2012.01) | |
| *B24B 49/08* | (2006.01) | |
| *B24B 37/04* | (2012.01) | |
| *B08B 3/02* | (2006.01) | |
| *H01L 21/67* | (2006.01) | |
| *B08B 5/02* | (2006.01) | |
| *H01L 21/687* | (2006.01) | |

(Continued)

(52) U.S. Cl.
CPC ............ *G01D 5/46* (2013.01); *B08B 3/022* (2013.01); *B08B 5/023* (2013.01); *B24B 7/228* (2013.01); *B24B 37/005* (2013.01); *B24B 37/04* (2013.01); *B24B 49/08* (2013.01); *H01L 21/67051* (2013.01); *H01L 21/67219* (2013.01); *H01L 21/67253* (2013.01); *H01L 21/67259* (2013.01); *H01L 21/68742* (2013.01); *B08B 2203/02* (2013.01); *G01D 5/42* (2013.01)

(58) Field of Classification Search
CPC ....... B24B 7/228; B24B 37/005; B24B 37/04; B24B 37/042; B24B 49/00; B24B 49/08; B08B 3/022; B08B 5/023; G01D 5/46
USPC ............................... 451/5, 9, 10, 11, 41, 54
See application file for complete search history.

(56) References Cited

U.S. PATENT DOCUMENTS

| | | | | |
|---|---|---|---|---|
| 6,368,049 B1* | 4/2002 | Osaka | ................... | H01L 21/681 414/783 |
| 6,899,111 B2* | 5/2005 | Luscher | ................... | B08B 3/04 134/137 |

(Continued)

FOREIGN PATENT DOCUMENTS

JP    2009-246027 A    10/2009

*Primary Examiner* — Eileen P Morgan
(74) *Attorney, Agent, or Firm* — Abelman, Frayne & Schwab (57) ABSTRACT

A polishing device has a substrate stage which holds a substrate Wf, a processing head which processes a surface of the substrate Wf, an indentation detecting system which detects a position of an indentation in the substrate Wf, a movement mechanism which moves the processing head in a radial direction of the substrate stage, and a rotation mechanism which rotates the substrate stage, and the indentation detecting system has a fluid injection nozzle configured to inject a fluid to a circumferential edge portion of the substrate Wf when the substrate Wf is held on the substrate stage, a fluid measuring device which measures a physical quantity which is pressure or a flow rate of the fluid, and a position detector which detects the position of the indentation formed in the circumferential edge portion of the substrate Wf based on a change in physical quantity.

18 Claims, 8 Drawing Sheets

(51) Int. Cl.
*B24B 7/22* (2006.01)
*G01D 5/42* (2006.01)

(56) References Cited

U.S. PATENT DOCUMENTS

| | | | |
|---|---|---|---|
| 7,638,096 B2 * | 12/2009 | Kim | G03F 7/162 |
| | | | 422/82.13 |
| 8,101,934 B2 * | 1/2012 | Chen | G01V 8/12 |
| | | | 250/559.36 |
| 2002/0189638 A1 * | 12/2002 | Luscher | H01L 21/67051 |
| | | | 134/1.3 |
| 2004/0266012 A1 * | 12/2004 | Kim | H01L 21/312 |
| | | | 436/5 |
| 2008/0006785 A1 * | 1/2008 | Chen | G01V 8/12 |
| | | | 250/559.3 |
| 2016/0074988 A1 * | 3/2016 | Yamaguchi | B24B 37/005 |
| | | | 438/8 |
| 2017/0259395 A1 * | 9/2017 | Kobata | B24B 37/20 |

\* cited by examiner

SUBSTRATE PROCESSING APPARATUS AND METHOD OF DETECTING INDENTATION FORMED IN SUBSTRATE

CROSS-REFERENCE TO RELATED APPLICATIONS

This application is based on and claims priority from Japanese Patent Application No. 2017-142991, filed on Jul. 24, 2017, with the Japan Patent Office, the disclosure of which is incorporated herein in their entireties by reference.

TECHNICAL FIELD

The present disclosure relates to a substrate processing apparatus for processing a surface of a substrate such as a wafer, and particularly, to an apparatus and a method for detecting an indentation formed in a circumferential edge portion of a substrate.

BACKGROUND

In order to locally process a part of a surface of a substrate such as a wafer, it is necessary to detect an orientation of the substrate before processing the substrate. Therefore, a detecting device configured to detect a position of an indentation such as an orientation flat or a notch in the substrate is used for detecting the orientation of the substrate.

The position of the indentation is detected by a method of detecting the position of the indentation based on a change in amount of light reflected by a circumferential edge portion of the substrate or based on a change in amount of light blocked by the circumferential edge portion of the substrate, or a method of capturing an image of the circumferential edge portion of the substrate using a camera from above the substrate and comparing data of captured images with predetermined image data for determination. In general, the aforementioned method of detecting the position of the indentation has been used in a semiconductor device manufacturing process of locally processing a part of the surface of the substrate. See, for example, Japanese Patent Laid-Open Publication No. 2009-246027.

SUMMARY

One aspect of the present disclosure provides a substrate processing apparatus including: a substrate stage configured to hold a substrate; a processing head configured to process a surface of the substrate; an indentation detecting system configured to detect a position of an indentation in the substrate; a movement mechanism configured to move the processing head in a radial direction of the substrate stage; and a rotation mechanism configured to rotate the substrate stage. The indentation detecting system includes: a fluid injection nozzle configured to inject a fluid to a circumferential edge portion of the substrate when the substrate is held on the substrate stage; a fluid measuring device configured to measure a physical quantity which is pressure or a flow rate of the fluid; and a position detector configured to detect the position of the indentation formed in the circumferential edge portion of the substrate based on a change in physical quantity.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The aforementioned detection method has a problem in that the position of the indentation in the substrate cannot be accurately detected in accordance with a detection environment. The detection method using a photoelectric sensor has a problem in that the accurate position of the indentation in the substrate cannot be detected when a processing liquid such as slurry, which is used to process the substrate, is attached to a light projection portion or a light receiving portion in the photoelectric sensor or attached to the surface of the substrate. Similarly, the detection method using a camera has a problem in that the accurate position of the indentation in the substrate cannot be detected when the processing liquid such as slurry falls onto the camera. In addition, the detection method using the camera also has a problem in that this method cannot be used for a substrate having a surface on which metal such as Cu, which is likely to be corroded by emitted light, is formed.

The present disclosure has been made in an effort to solve the aforementioned problems in the related art, and an object of the present disclosure is to provide a substrate processing apparatus capable of processing a surface of a substrate by detecting an accurate position of an indentation in a substrate regardless of a detection environment. In addition, an object of the present disclosure is to provide a method capable of detecting an accurate position of an indentation in a substrate regardless of a detection environment.

In order to solve the object as described above, one aspect of the present disclosure provides a substrate processing apparatus including: a substrate stage configured to hold a substrate; a processing head configured to process a surface of the substrate; an indentation detecting system configured to detect a position of an indentation in the substrate; a movement mechanism configured to move the processing head in a radial direction of the substrate stage; and a rotation mechanism configured to rotate the substrate stage. The indentation detecting system includes: a fluid injection nozzle configured to inject a fluid to a circumferential edge portion of the substrate when the substrate is held on the substrate stage; a fluid measuring device configured to measure a physical quantity which is pressure or a flow rate of the fluid; and a position detector configured to detect the position of the indentation formed in the circumferential edge portion of the substrate based on a change in physical quantity.

In the aspect of the present disclosure, the position detector may compare a difference between a newest measured value and a previously measured value of the physical quantity with a predetermined threshold value, and determine the position of the indentation based on a result of the comparison.

In the aspect of the present disclosure, the position detector may determine the position of the indentation based on the rotation angle of the substrate stage when the difference reaches the threshold value.

In the aspect of the present disclosure, the position detector may compare a measured value of the physical quantity with a predetermined threshold value, and determine the position of the indentation based on a result of the comparison.

In the aspect of the present disclosure, the position detector determines the position of the indentation based on the rotation angle of the substrate stage when the measured value of the physical quantity reaches the threshold value.

In the aspect of the present disclosure, the substrate processing apparatus may further include a control device configured to calculate a position of the substrate stage, which is required for a target region of the substrate to reach a processing position of the processing head, based on the detected position of the indentation.

In the aspect of the present disclosure, fluid may be any one of pure water, clean air, and $N_2$ gas.

In the aspect of the present disclosure, the physical quantity may be pressure of the fluid, and the fluid measuring device may be a pressure sensor.

In the aspect of the present disclosure, the physical quantity may be a flow rate of the fluid, and the fluid measuring device may be a flow rate sensor.

In the aspect of the present disclosure, the processing head may be a polishing head configured to polish the surface of the substrate.

In the aspect of the present disclosure, the processing head may be a pencil-type cleaning tool configured to scrub the surface of the substrate.

Another aspect of the present disclosure provides a method of detecting a position of an indentation formed in a circumferential edge portion of a substrate. The method includes: holding the substrate on a substrate stage; injecting a fluid to a circumferential edge portion of the substrate while rotating the substrate and the substrate stage; measuring a physical quantity which is pressure or a flow rate of the fluid; and detecting the position of the indentation formed in the circumferential edge portion of the substrate based on a change in physical quantity.

In the aspect of the present disclosure, the detecting the position of the indentation based on the change in physical quantity may include comparing a difference between a newest measured value and a previously measured value of the physical quantity with a predetermined threshold value, and determining the position of the indentation based on a result of the comparison.

In the aspect of the present disclosure, the determining the position of the indentation based on the comparison result may include determining the position of the indentation based on a rotation angle of the substrate stage when the difference reaches the threshold value.

In the aspect of the present disclosure, the detecting the position of the indentation based on the change in physical quantity includes comparing a measured value of the physical quantity with a predetermined threshold value, and determining the position of the indentation based on a result of the comparison.

In the aspect of the present disclosure, the determining the position of the indentation based on the comparison result may include determining the position of the indentation based on a rotation angle of the substrate stage when the measured value of the physical quantity reaches the threshold value.

In the aspect of the present disclosure, the injecting the fluid to the circumferential edge portion of the substrate while rotating the substrate and the substrate stage may include injecting the fluid to the circumferential edge portion of the substrate while rotating the substrate and the substrate stage in a first direction and a second direction opposite to the first direction, and the detecting the position of the indentation based on the change in physical quantity may include detecting a first position of the indentation formed in the circumferential edge portion of the substrate based on the change in physical quantity when the substrate and the substrate stage are rotated in the first direction, detecting a second position of the indentation based on the change in physical quantity when the substrate and the substrate stage are rotated in the second direction, and determining the position of the indentation which is an average of the first position and the second position.

According to the present disclosure, pressure or a flow rate, which is a physical quantity that does not substantially vary in accordance with a detection environment, is measured. Therefore, it is possible to detect an accurate position of an indentation based on a change in pressure or flow rate.

Figure 1:
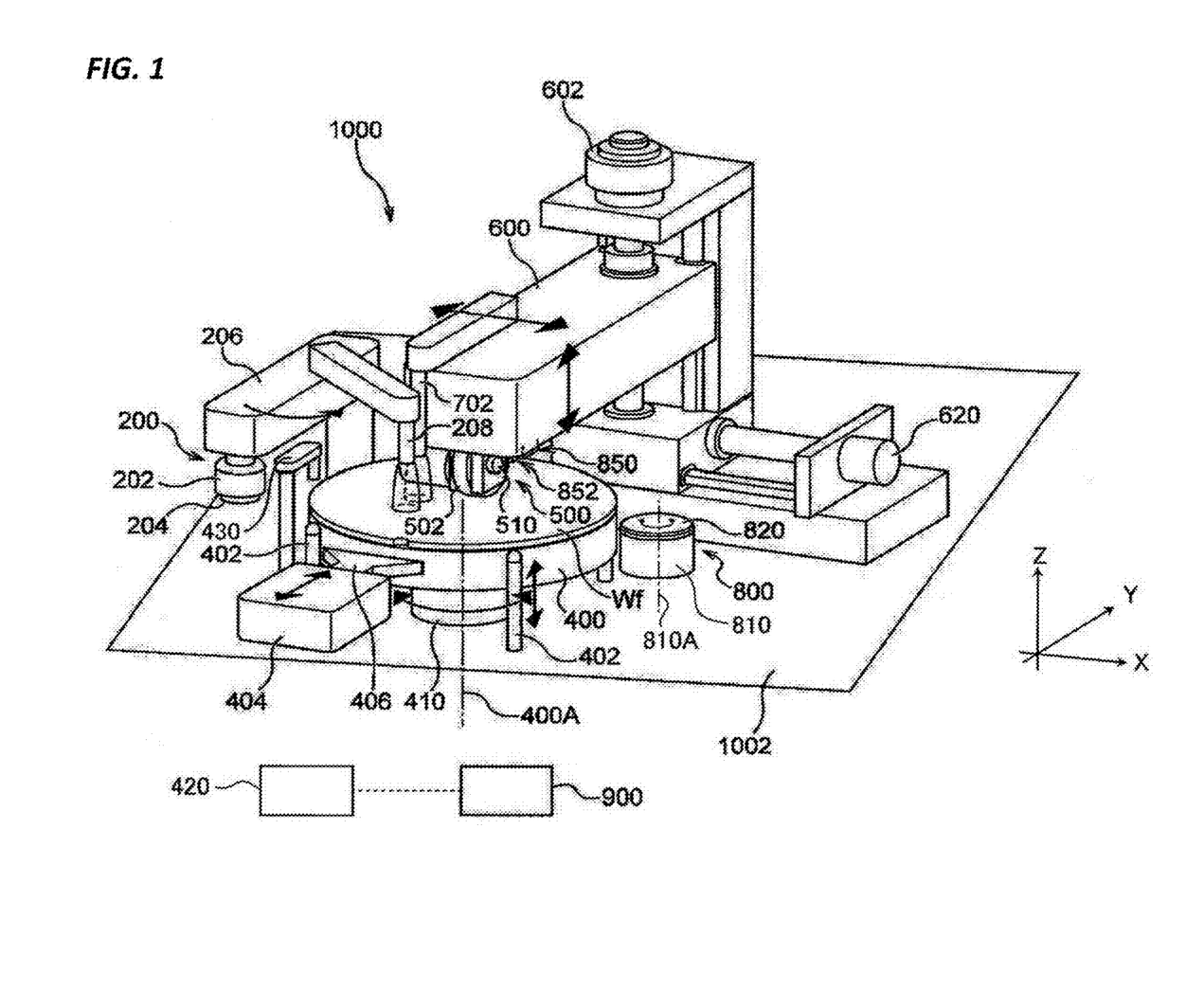
FIG. 1 is a schematic view illustrating a substrate processing apparatus according to an exemplary embodiment of a substrate processing apparatus of the present disclosure.

Hereinafter, an exemplary embodiment of the present invention will be described with reference to the drawings. FIG. 1 is a schematic view illustrating a partial polishing device according to an exemplary embodiment of a substrate processing apparatus of the present disclosure. As illustrated in FIG. 1, a partial polishing device 1000 is configured on a base surface 1002. The partial polishing device 1000 is installed in a non-illustrated casing. The casing has a non-illustrated gas injection mechanism, and the casing is configured such that a polish liquid and the like are not exposed to the outside of the casing during polishing processing.

As illustrated in FIG. 1, the partial polishing device 1000 has a substrate stage 400 that holds a substrate Wf upward. In one exemplary embodiment, the substrate Wf may be placed on the substrate stage 400 by a non-illustrated transport device. The illustrated partial polishing device 1000 has four lift pins 402, which are movable upward and downward, around the substrate stage 400, and the substrate Wf may be received on the four lift pins 402 from the transport device in a state in which the lift pins 402 are moved upward. The substrate Wf is temporarily placed on the stage as the lift pins 402 are moved downward to a substrate delivery position at which the substrate Wf is delivered to the substrate stage 400, after the substrate Wf is loaded onto the lift pins 402. For this reason, the substrate Wf may be positioned within a limited region inside the four lift pins 402.

However, in a case in which the substrate Wf needs to be positioned with higher precision, the substrate Wf may be positioned at a predetermined position on the substrate stage 400 by a separate positioning mechanism 404. In the exemplary embodiment illustrated in FIG. 1, the substrate Wf may be positioned by positioning pins (not illustrated) and a positioning pad 406. The positioning mechanism 404 has the positioning pad 406 which is movable in an in-plane direction of the substrate Wf. A plurality of positioning pins (not illustrated) are provided at a side opposite to the positioning pad 406 based on the substrate stage 400. The substrate Wf may be positioned by the positioning pad 406 and the positioning pins by pressing the positioning pad 406 against the substrate Wf in a state in which the substrate Wf is placed on the lift pins 402. When the substrate Wf is positioned, the substrate Wf is fixed onto the substrate stage 400, and then the lift pins 402 are moved downward such that the substrate Wf may be placed on the substrate stage 400. The substrate stage 400 may be configured such that the substrate Wf is fixed onto the substrate stage 400 by, for example, vacuum suction. An upper surface of the substrate stage 400 has a stage surface (not illustrated in FIG. 1) on which the substrate Wf is held.

When detaching the substrate Wf from the substrate stage 400, the lift pins 402 are moved to a substrate receiving position at which the substrate Wf is received from the substrate stage 400, and then the vacuum suction of the substrate stage 400 is released. Further, the lift pins 402 are moved upward to a substrate delivery position at which the substrate Wf is delivered to the transport device, and then a non-illustrated transport device may receive the substrate Wf on the lift pins 402. The substrate Wf may then be delivered to an arbitrary location by the transport device in order to perform subsequent processing.

The substrate stage 400 has a rotation mechanism 410 so that the substrate stage 400 is rotatable about an axial center 400A. Further, as another exemplary embodiment, the substrate stage 400 may have a movement mechanism that imparts rectilinear motion to the held substrate Wf.

The partial polishing device 1000 has a control device 900. The rotation mechanism 410 is electrically connected to the control device 900. An operation of the rotation mechanism 410 is controlled by the control device 900. The control device 900 has a calculation unit that calculates a target polishing amount within a region of the substrate Wf to be polished. The control device 900 is configured to control the partial polishing device 1000 based on the target polishing amount calculated by the calculation unit. Further, the control device 900 may be configured by installing a predetermined program in a typical computer having a storage device, a CPU, input and output mechanisms, and the like.

The partial polishing device 1000 illustrated in FIG. 1 also has an indentation detecting system 430. The indentation detecting system 430 serves to detect a position of an indentation such as an orientation flat or a notch formed in a circumferential edge portion of the substrate Wf, and the indentation detecting system 430 is electrically connected to the control device 900. An operation of the indentation detecting system 430 is controlled by the control device 900. In addition, the control device 900 determines a polishing position and a polishing amount of the substrate Wf based on the position of the indentation in the substrate Wf detected by the indentation detecting system 430 and based on a surface condition of the substrate Wf detected by a surface condition detector 420 that will be described below and serves to detect the surface condition of the substrate Wf. Therefore, it is possible to locally polish a part of the surface of the substrate Wf.

The partial polishing device 1000 illustrated in FIG. 1 has a processing head 500 that processes the surface of the substrate Wf. The processing head 500 holds a processing pad 502. In the present exemplary embodiment, the processing head 500 is a polishing head that polishes the surface of the substrate Wf, and the processing pad 502 is a polishing pad that polishes the surface of the substrate Wf while being in sliding contact with the surface of the substrate Wf.

Figure 2:
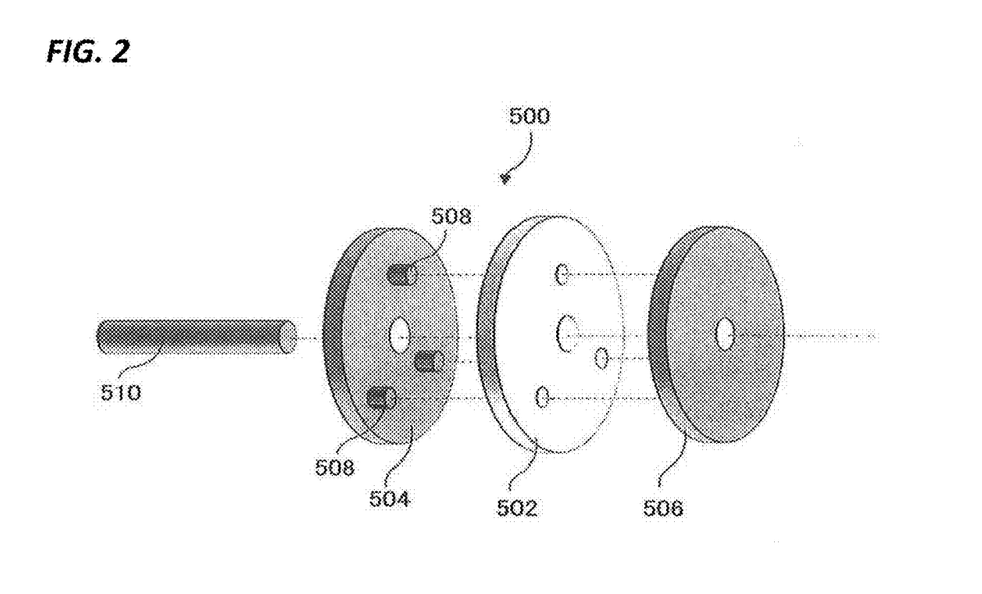
FIG. 2 is a schematic view illustrating a mechanism for holding a processing pad of a processing head.

FIG. 2 is a schematic view illustrating a mechanism configured to hold the processing pad 502 of the processing head 500. As illustrated in FIG. 2, the processing head 500 has a first holding member 504 and a second holding member 506. The processing pad 502 is held between the first holding member 504 and the second holding member 506. All of the first holding member 504, the processing pad 502, and the second holding member 506 have a circular plate shape. A diameter of each of the first holding member 504 and the second holding member 506 is smaller than a diameter of the processing pad 502. For this reason, the processing pad 502 is exposed from an edge of the first holding member 504 and an edge of the second holding member 506 in a state in which the processing pad 502 is held by the first holding member 504 and the second holding member 506.

Each of the first holding member 504, the processing pad 502, and the second holding member 506 has an opening at a center thereof, and a rotating shaft 510 is inserted into the opening of the first holding member 504, the opening of the processing pad 502, and the opening of the second holding member 506. One or more guide pins 508, which protrude toward the processing pad 502, are provided on a surface of the first holding member 504 directed toward the processing pad 502. Meanwhile, the processing pad 502 has through holes formed at positions corresponding to the guide pins 508, and concave portions, which receive the guide pins 508, are also formed in a surface of the second holding member 506 directed toward the processing pad 502. For this reason, the processing pad 502 may rotate integrally with the holding members 504 and 506 without slipping when the first holding member 504 and the second holding member 506 are rotated by the rotating shaft 510. In the exemplary embodiment illustrated in FIG. 1, the processing head 500 holds the processing pad 502 so that a side surface of the processing pad 502 having a circular plate shape is directed toward the substrate Wf.

The partial polishing device 1000 illustrated in FIG. 1 also has a holding arm 600 that holds the processing head 500. The holding arm 600 has a first driving mechanism (not illustrated) configured to impart a motion to the processing pad 502 in a first motion direction with respect to the substrate Wf. The "first motion direction" used herein means the motion of the processing pad 502 configured to polish the substrate Wf, and means rotational motion of the processing pad 502 in the partial polishing device 1000 illustrated in FIG. 1. For this reason, the first driving mechanism may be configured by, for example, a typical motor. Because the processing pad 502 is moved in parallel with the surface of the substrate Wf (a tangential direction of the processing pad 502; a Y direction in FIG. 1) at a contact portion between the substrate Wf and the processing pad 502, the "first motion direction" may be considered as a predetermined straight direction even though the first motion direction means the rotational motion of the processing pad 502.

A contact region between the processing pad 502 and the substrate Wf is determined based on a diameter and a thickness of the processing pad 502. As an example, the diameter of the processing pad 502 may range from about 50 mm to about 300 mm, and the thickness of the processing pad 502 may range from about 1 mm to about 10 mm. The first driving mechanism is electrically connected to the control device 900. An operation of the first driving mechanism is controlled by the control device 900.

The partial polishing device 1000 has a vertical driving mechanism 602 configured to move the holding arm 600 in a direction (a Z direction in FIG. 1) perpendicular to the surface of the substrate Wf. The processing head 500, together with the holding arm 600, may be moved by the vertical driving mechanism 602 in the direction perpendicular to the surface of the substrate Wf. The vertical driving mechanism 602 also serves as a pressing mechanism for pressing the processing pad 502 against the substrate Wf when polishing a part of the substrate Wf. The vertical driving mechanism 602 is a mechanism using a motor and a ball screw in the exemplary embodiment illustrated in FIG. 1, but as another exemplary embodiment, the vertical driving mechanism 602 may be a pneumatic or hydraulic driving mechanism or a driving mechanism using a spring. In addition, as one exemplary embodiment, different driving mechanisms for coarse motion and fine motion may be used as the vertical driving mechanism 602 for the processing head 500. For example, a driving mechanism using a motor may be used as the driving mechanism for coarse motion, and a driving mechanism using an air cylinder may be used as the driving mechanism for fine motion for pressing the processing pad 502 against the substrate Wf.

In this case, it is possible to control pressing force for pressing the processing pad 502 against the substrate Wf by adjusting air pressure in the air cylinder while monitoring the pressing force of the processing pad 502. In addition, on the contrary, the air cylinder may be used as the driving mechanism for coarse motion, and the motor may be used as the driving mechanism for fine motion. In the case in which the motor is used as the driving mechanism for fine motion, it is possible to control the pressing force for pressing the processing pad 502 against the substrate Wf by controlling the motor while monitoring torque of the motor for fine motion. In addition, as another driving mechanism, a piezo element may be used, and a movement amount may be adjusted by adjusting a voltage to be applied to the piezo element. Further, in the case in which the vertical driving mechanism 602 includes the driving mechanism for fine motion and the driving mechanism for coarse motion, the driving mechanism for fine motion may be provided at a position at which the processing pad 502 of the holding arm 600 is held, that is, at a tip of the arm 600 in an example illustrated in FIG. 1. The vertical driving mechanism 602 is electrically connected to the control device 900. An operation of the vertical driving mechanism 602 is controlled by the control device 900.

The partial polishing device 1000 illustrated in FIG. 1 has a movement mechanism 620 configured to move the holding arm 600 in a second motion direction (an X direction in FIG. 1). The processing head 500 and the processing pad 502, together with the holding arm 600, may be moved by the movement mechanism 620 in the second motion direction. Further, the second motion direction (X direction) is a radial direction of the substrate stage 400, and in the present exemplary embodiment, the second motion direction is a direction perpendicular to the aforementioned first motion direction. The partial polishing device 1000 may move the processing head 500 to a predetermined position in a radial direction of the substrate stage 400 using the movement mechanism 620. Therefore, the partial polishing device 1000 may partially polish a predetermined position of the surface of the substrate Wf. The movement mechanism 620 is electrically connected to the control device 900. An operation of the movement mechanism 620 is controlled by the control device 900.

If a contact state between the processing pad 502 and the substrate Wf is not uniform, a variation occurs in processing mark shapes on the substrate Wf, and particularly, a variation occurs in polishing speed in a direction perpendicular to the first motion direction at the contact surface between the processing pad 502 and the substrate Wf. However, the processing pad 502 is moved in the direction perpendicular to the first motion direction during the polishing such that polishing non-uniformity may be mitigated, and as a result, the processing mark shapes may be further uniform. Further, in the exemplary embodiment illustrated in FIG. 1, the vertical driving mechanism 602 is a mechanism using a motor and a ball screw. In addition, in the exemplary embodiment illustrated in FIG. 1, the movement mechanism 620 is configured to move the holding arm 600 together with the vertical driving mechanism 602. Further, the second motion direction may not be strictly perpendicular to the first motion direction, and an effect of making processing mark shapes uniform may be achieved as long as the second motion direction is a direction having a component perpendicular to the first motion direction.

The partial polishing device 1000 according to the exemplary embodiment illustrated in FIG. 1 has a polish liquid supply nozzle 702. The polish liquid supply nozzle 702 is fluidly connected to a supply source (not illustrated) configured to supply a polish liquid, for example, slurry. In addition, in the partial polishing device 1000 according to the exemplary embodiment illustrated in FIG. 1, the polish liquid supply nozzle 702 is held on the holding arm 600. For this reason, the polish liquid may be effectively supplied only to the polishing region on the substrate Wf through the polish liquid supply nozzle 702.

The partial polishing device 1000 according to the exemplary embodiment illustrated in FIG. 1 has a cleaning mechanism 200 configured to clean the substrate Wf. In the exemplary embodiment illustrated in FIG. 1, the cleaning mechanism 200 has a cleaning head 202, a cleaning member 204, a cleaning head holding arm 206, and a rinse nozzle 208. The cleaning member 204 is a member that comes into contact with the substrate Wf while rotating to clean the substrate Wf after the substrate Wf is partially polished. As one exemplary embodiment, the cleaning member 204 may be formed by a PVA sponge. However, instead of or in addition to the PVA sponge, the cleaning member 204 may have a cleaning nozzle that embodies megasonic cleaning, high-pressure water cleaning, or binary fluid cleaning. The cleaning member 204 is held on the cleaning head 202. In addition, the cleaning head 202 is held on the cleaning head holding arm 206. The cleaning head holding arm 206 has a driving mechanism configured to rotate the cleaning head 202 and the cleaning member 204. The driving mechanism may be configured by, for example, a motor or the like. The driving mechanism is electrically connected to the control device 900, and an operation of the driving mechanism is controlled by the control device 900.

In addition, the cleaning head holding arm 206 has a pivot mechanism so that the cleaning head holding arm 206 pivots in an area inside the substrate Wf. The cleaning mechanism 200 has the rinse nozzle 208. A non-illustrated cleaning liquid supply source is connected to the rinse nozzle 208. The cleaning liquid may be, for example, pure water, a chemical liquid, or the like. In the exemplary embodiment of FIG. 1, the rinse nozzle 208 may be mounted on the cleaning head holding arm 206. The rinse nozzle 208 has a pivot mechanism so that the rinse nozzle 208 pivots in an area inside the substrate Wf in the state in which the rinse nozzle 208 is held on the cleaning head holding arm 206. The pivot mechanism is electrically connected to the control device 900, and an operation of the pivot mechanism is controlled by the control device 900.

The partial polishing device 1000 according to the exemplary embodiment illustrated in FIG. 1 has a conditioning unit 800 configured to condition the processing pad 502. The conditioning unit 800 is disposed outside the substrate stage 400. The conditioning unit 800 has a dress stage 810 that holds a dresser 820. In the exemplary embodiment of FIG. 1, the dress stage 810 is rotatable about a rotational axis 810A. In the partial polishing device 1000 in FIG. 1, the processing pad 502 may be conditioned by pressing the processing pad 502 against the dresser 820 and rotating the processing pad 502 and the dresser 820. Further, as another exemplary embodiment, the dress stage 810 may be configured to perform rectilinear motion (including reciprocating motion) instead of the rotational motion. Further, in the partial polishing device 1000 of FIG. 1, the conditioning unit 800 is mainly used to condition the processing pad 502 after finishing the partial polishing at any one point on the substrate Wf and before performing the partial polishing at a next point or on a next substrate Wf. Here, the dresser 820 may be formed by, for example, (1) a diamond dresser having a surface on which diamond particles are electrically attached and fixed, (2) a diamond dresser having diamond abrasive grains disposed on the entirety or a part of the contact surface with the processing pad 502, (3) a brush dresser having brush bristles made of resin and disposed on the entirety or a part of the contact surface with the processing pad 502, and (4) any one or any combination of the aforementioned dressers. The conditioning unit 800 is electrically connected to the control device 900. An operation of the conditioning unit 800 is controlled by the control device 900.

The partial polishing device 1000 according to the exemplary embodiment illustrated in FIG. 1 has a second conditioner 850. The second conditioner 850 serves to condition the processing pad 502 while the substrate Wf is polished by the processing pad 502. For this reason, the second conditioner 850 may also be called an in-situ conditioner. The second conditioner 850 is held on the holding arm 600 in the vicinity of the processing pad 502. The second conditioner 850 has a non-illustrated conditioning member movement mechanism that serves to move a conditioning member 852 in a direction in which the conditioning member 852 is pressed against the processing pad 502. In the exemplary embodiment of FIG. 1, the conditioning member 852 is held in the vicinity of the processing pad 502 so as to be spaced apart from the processing pad 502 in the Y direction, and the conditioning member 852 is configured to be movable in the Y direction by the conditioning member movement mechanism. The conditioning member movement mechanism is electrically connected to the control device 900. An operation of the conditioning member movement mechanism is controlled by the control device 900.

In addition, the conditioning member 852 is configured to perform rotational motion or rectilinear motion by a non-illustrated conditioning member driving mechanism. For this reason, during the process of polishing the substrate Wf, the processing pad 502 may be conditioned by pressing the conditioning member 852 against the processing pad 502 while rotating the conditioning member 852 when the substrate Wf is polished by the processing pad 502. The conditioning member driving mechanism is electrically connected to the control device 900. An operation of the conditioning member driving mechanism is controlled by the control device 900.

The partial polishing device 1000 has a surface condition detector 420 configured to detect a surface condition of the substrate Wf. The surface condition detector 420 may be, for example, an in-line thickness monitor (Wet-ITM). In the Wet-ITM, a detection head is present not to be in contact with the substrate Wf, and a distribution of thicknesses of a film formed on the substrate Wf (or a distribution of information associated with the thicknesses of the film) may be detected (measured) as the detection head moves over the entire surface of the substrate Wf.

In addition to the Wet-ITM, any type of detector may be used as the surface condition detector 420. For example, as an available detection method, non-contact type detection method such as a publicly known eddy current type or optical type detection method may be adopted, or a contact type detection method may be adopted. As a contact type detection method, for example, an electric resistance type detection method may be adopted which detects a distribution of resistance of the film by preparing a detection head having an electrically conductive probe and scanning the surface of the substrate Wf in a state in which the probe is in contact with the substrate Wf to supply electric power to the substrate Wf.

As another contact type detection method, a level difference detection method may be adopted which detects a distribution of uneven portions of the surface by monitoring the upward and downward movements of the probe by scanning the surface of the substrate Wf in a state in which the probe is in contact with the surface of the substrate Wf. In any detection method of the contact type and non-contact type detection methods, a detected output is a thickness of the film or a signal corresponding to the thickness of the film. In the optical type detection method, a difference in thickness of the film may be recognized based on a difference in color tone of the surface of the substrate Wf in addition to the amount of reflected light projected onto the surface of the substrate Wf. Further, when detecting the thickness of the film on the substrate Wf, the thickness of the film may be detected while rotating the substrate Wf and pivoting the detector in the radial direction.

In this way, it is possible to obtain information about a surface condition such as the thickness of the film or the level difference over the entire surface of the substrate Wf. In addition, since the position of the indentation such as an orientation flat or a notch is used as a reference, data such as the thicknesses of the film may be associated with not only the position in the radial direction but also the position in the circumferential direction, and as a result, it is possible to obtain the thickness of the film or the level difference of the substrate Wf or a distribution of signals associated with the thickness of the film or the level difference of the substrate Wf. In addition, during the partial polishing, the operation of the substrate stage 400 and the operation of the holding arm 600 may be controlled based on the present position data. In one exemplary embodiment, the surface condition detector 420 may be a stand-alone type surface condition detector provided separately from the partial polishing device 1000. In one exemplary embodiment, the surface condition detector 420 may be a device for measuring a distribution of particles present on the surface of the substrate Wf. The substrate Wf is transported to the surface condition detector 420 by a non-illustrated transport device and then transported to the substrate stage 400.

Figure 3:
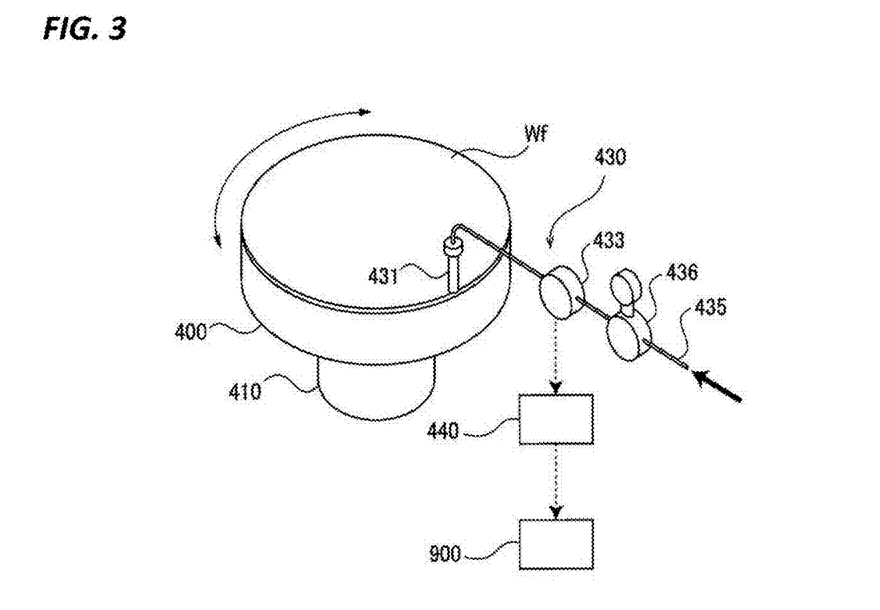
FIG. 3 is a schematic view illustrating an indentation detecting system in FIG. 1.

FIG. 3 is a schematic view illustrating an indentation detecting system 430 in FIG. 1. The indentation detecting system 430 has a fluid injection nozzle 431 which injects a fluid toward the circumferential edge portion of the substrate Wf, a fluid measuring device 433 which measures physical quantities of the fluid, a fluid supply tube 435 which supplies the fluid into the fluid injection nozzle 431, a pressure regulator 436 which is mounted on the fluid supply tube 435, and a position detector 440 which detects a position of an indentation formed in the circumferential edge portion of the substrate Wf based on a change in physical quantities of the fluid. The fluid injection nozzle 431 is disposed to be directed downward in the vertical direction so that a tip of the fluid injection nozzle 431 is directed toward the substrate stage 400, and the fluid injection nozzle 431 is connected to the fluid supply tube 435.

In the present exemplary embodiment, the measured physical quantity of the fluid is pressure or a flow rate of the fluid, and the fluid measuring device 433 is any one of a pressure sensor and a flow rate sensor. In one exemplary embodiment, the fluid measuring device 433 may have both of the pressure sensor and the flow rate sensor. The fluid measuring device 433 is electrically connected to the position detector 440 and transmits a measured value of the physical quantity of the fluid to the position detector 440. The position detector 440 is electrically connected to the control device 900. The position detector 440 detects the position of the indentation in the substrate Wf based on a change in measured value of the fluid and transmits information about the position of the indentation in the substrate Wf to the control device 900.

As indicated by the arrows in FIG. 3, the fluid is supplied into the fluid injection nozzle 431 via the fluid supply tube 435 from a fluid supply source (not illustrated) disposed outside the partial polishing device 1000. For example, the fluid supply source may be a canister or a fluid supply line in a factory in which the partial polishing device 1000 is installed. The pressure of the fluid to be supplied into the fluid supply tube 435 is stabilized by the pressure regulator 436 and remains constant. The aforementioned fluid is a liquid such as pure water in the present exemplary embodiment, but in one exemplary embodiment, the aforementioned fluid may be gas such as clean air or $N_2$ gas.

Next, an indentation detecting method of the indentation detecting system 430 will be described in detail. First, the substrate Wf is loaded onto a stage surface 401 on the substrate stage 400 by the four lift pins 402. The substrate Wf is held on the stage surface 401 by vacuum suction or the like. Next, the substrate stage 400 is rotated together with the substrate Wf by the rotation mechanism 410. The rotation mechanism 410 may be configured by, for example, a servo motor such as a stepping motor.

Figure 4:
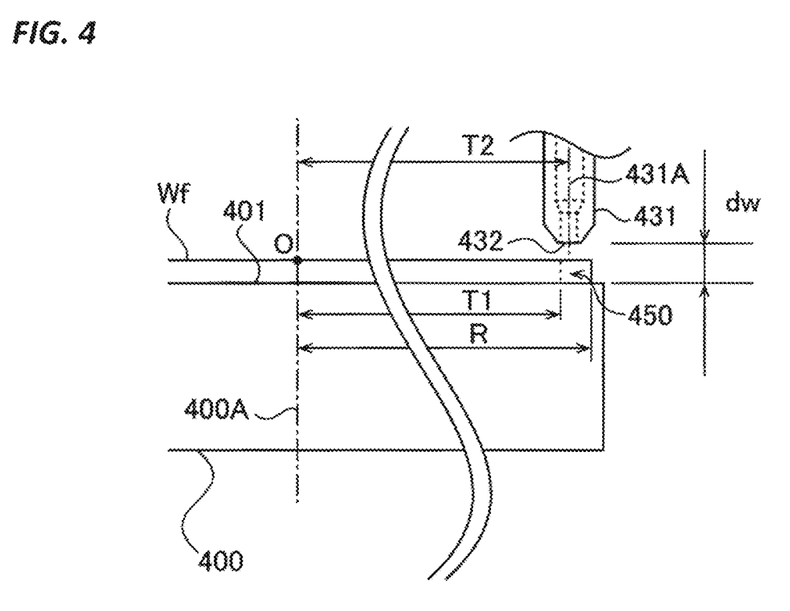
FIG. 4 is a view illustrating a state in which a fluid injection nozzle approaches a circumferential edge portion of a substrate when viewed laterally.

The fluid injection nozzle 431 is moved to a position above the circumferential edge portion of the substrate Wf by a non-illustrated nozzle movement mechanism while the substrate Wf is rotated. Thereafter, the fluid injection nozzle 431 is moved downward by the nozzle movement mechanism such that the fluid injection nozzle 431 approaches the circumferential edge portion of the substrate Wf which are rotating as illustrated in FIG. 4. FIG. 4 is a view illustrating a state in which the fluid injection nozzle 431 approaches the circumferential edge portion of the substrate Wf when viewed laterally. A distance T2 between the axial center 400A of the substrate stage 400 and a centerline 431A of the fluid injection nozzle 431 is equal to or greater than a distance T1 from a center O of the substrate Wf to an end of an innermost side of an indentation 450 formed in the circumferential edge portion of the substrate Wf, and the distance T2 is smaller than a radius R of the substrate Wf.

The fluid injection nozzle 431 has a fluid injection port 432 formed at a tip thereof. In the state in which the fluid injection nozzle 431 approaches the circumferential edge portion of the substrate Wf, the fluid is injected downward in the vertical direction from the fluid injection nozzle 431. That is, the fluid is injected onto the circumferential edge portion of the substrate Wf. The physical quantity such as the pressure of the fluid flowing through the fluid supply tube 435 is measured by the fluid measuring device 433. The aforementioned physical quantity is measured at every predetermined unit time while the fluid is injected. Since the substrate stage 400 is rotated during the injection of the fluid, the fluid is injected along the entire circumference of the circumferential edge portion of the substrate Wf. The fluid measuring device 433 transmits the measured value of the physical quantity of the fluid to the position detector 440. The physical quantity of the fluid is measured until the substrate Wf rotates a predetermined number of times. After the substrate Wf rotates the predetermined number of times, the fluid injection nozzle 431 stops the injection of the fluid, and the fluid measuring device 433 finishes the measurement of the physical quantity of the fluid.

The precision in detecting the position of the indentation is improved if a distance between the tip of the fluid injection nozzle 431 and the surface of the substrate Wf is decreased. In the present exemplary embodiment, a distance dw from the tip of the fluid injection nozzle 431 to the stage surface 401 is a distance made by adding the thickness of the substrate Wf to 0.05 mm to 0.2 mm. In one exemplary embodiment, the fluid may be introduced into the pressure regulator 436 after the pressure of the fluid supplied from the fluid supply source such as the fluid supply line in the factory is increased by a pump or the like. As the pressure of the fluid is increased, the precision in detecting the position of the indentation is improved.

Figure 5:
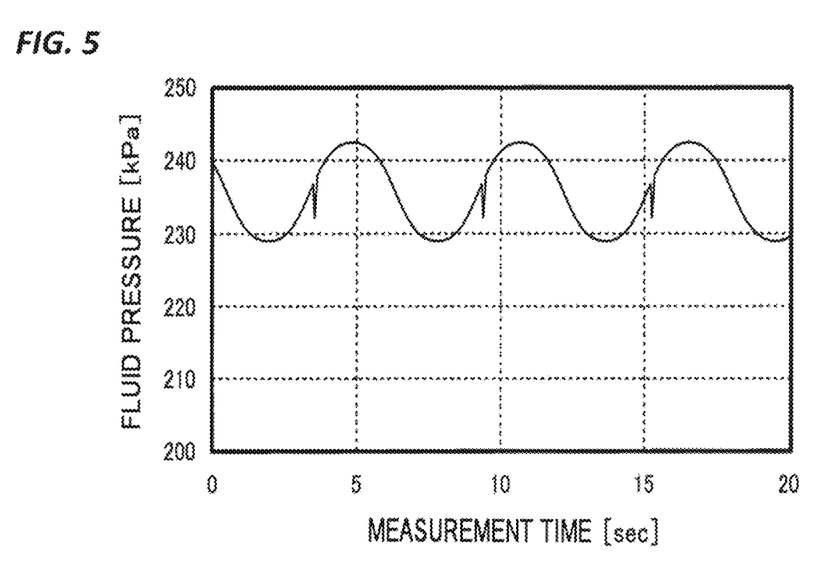
FIG. 5 is a view illustrating physical quantities measured by a fluid measuring device.

FIG. 5 is a view illustrating the pressure as a physical quantity measured by the fluid measuring device 433. In FIG. 5, a vertical axis indicates the pressure of the fluid, and a horizontal axis indicates measurement times. The stage surface 401 of the substrate stage 400 is not completely perpendicular to the axial center 400A of the substrate stage 400. For this reason, during the rotation of the substrate stage 400, the distance from the tip of the fluid injection nozzle 431 to the circumferential edge portion of the substrate Wf (the distance from the tip of the fluid injection nozzle 431 to the surface of the substrate Wf) varies periodically. During the injection of the fluid, the pressure of the fluid varies in accordance with the aforementioned variation in distance. In the example illustrated in FIG. 5, the periodic variation in pressure of the fluid is indicated by a sine wave.

The fluid is injected downward in the vertical direction from the fluid injection nozzle 431 such that when the indentation such as the orientation flat or the notch reaches a position directly under the fluid injection nozzle 431 by the rotation of the substrate stage 400, at least a part of the flow of the fluid passes through the indentation in the substrate Wf without colliding with the substrate Wf. As a result, the physical quantity of the fluid varies rapidly. In the example illustrated in FIG. 5, a rapid decrease in pressure indicates that the indentation in the substrate Wf is positioned at a position directly under the fluid injection nozzle 431.

Figure 6:
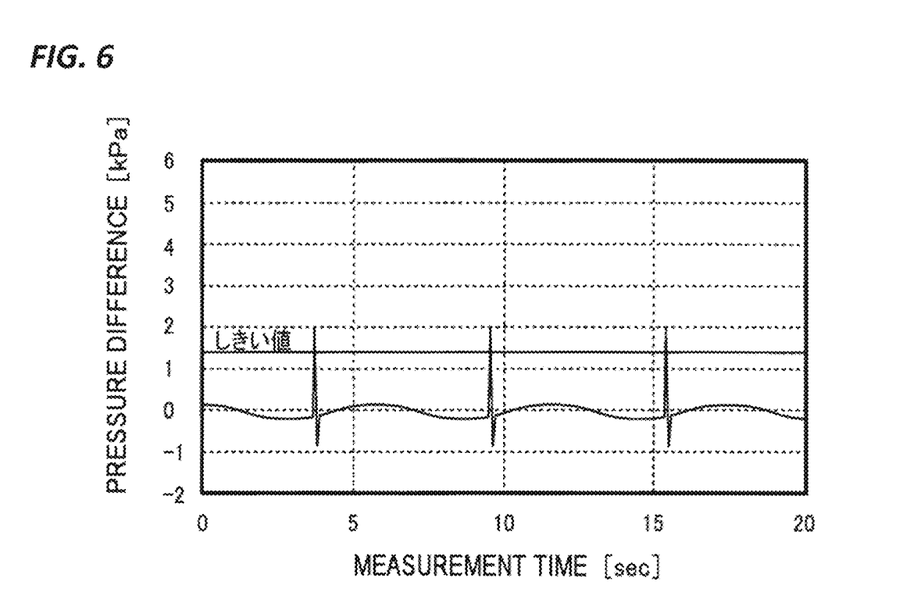
FIG. 6 is a view illustrating a difference between measured values of the physical quantities measured by the fluid measuring device.

FIG. 6 is a view illustrating a difference between the measured values of the pressure as the physical quantity measured by the fluid measuring device 433. Specifically, the graph illustrated in FIG. 6 indicates a change in difference between a newest measured value and a previously measured value of the pressure as the physical quantity with respect to the time axis. The difference between the newest measured value and the previously measured value may be a value made by subtracting the previously measured value from the newest measured value, or may be a value made by subtracting the newest measured value from the previously measured value. Each time the position detector 440 receives the newest measured value of the physical quantity from the fluid measuring device 433, the position detector 440 calculates the difference between the newest measured value and the previously measured value of the physical quantity, and compares the calculated difference with a predetermined threshold value. The position detector 440 determines the position of the indentation based on the aforementioned comparison result. The position of the indentation may be specified based on a rotation angle about the axial center 400A of the substrate stage 400. In other words, the position of the indentation may be indicated by the rotation angle about the axial center 400A of the substrate stage 400. The position detector 440 is connected to the rotation mechanism 410, and a signal, which indicates the rotation angle about the axial center 400A of the substrate stage 400, is transmitted to the position detector 440 from the rotation mechanism 410.

The position detector 440 determines the position of the indentation based on the rotation angle of the substrate stage 400 when the aforementioned difference reaches the threshold value. In the present exemplary embodiment, the position detector 440 determines the position of the indentation specified based on the rotation angle of the substrate stage 400 at a point in time at which the aforementioned difference reaches the threshold value. In one exemplary embodiment, the position detector 440 may calculate a correction rotation angle by adding a predetermined angle to the rotation angle of the substrate stage 400 at a point in time at which the aforementioned difference reaches the threshold value, and the position detector 440 may determine the position of the indentation specified based on the correction rotation angle.

In a case in which the stage surface 401 of the substrate stage 400 is completely perpendicular to the axial center 400A of the substrate stage 400, the physical quantity of the fluid is not indicated by the sine wave illustrated in FIG. 5. In this case, the position detector 440 may compare the measured value of the physical quantity with the predetermined threshold value, and may determine the position of the indentation in the substrate Wf based on the comparison result. In one exemplary embodiment, the position detector 440 determines the position of the indentation based on the rotation angle of the substrate stage when the measured value of the physical quantity reaches the threshold value.

In one exemplary embodiment, the indentation detecting system 430 may detect a first position of the indentation in the substrate Wf, through the method described with reference to FIGS. 3 to 6, by injecting the fluid to the circumferential edge portion of the substrate Wf while rotating the substrate Wf and the substrate stage 400 in a first direction (e.g., clockwise), and the indentation detecting system 430 may detect a second position of the indentation, through the method described with reference to FIGS. 3 to 6, by injecting the fluid to the circumferential edge portion of the substrate Wf while rotating the substrate Wf and the substrate stage 400 in a second direction (e.g., counterclockwise) opposite to the first direction, and the indentation detecting system 430 may determine an average of the first position and the second position as the position of the indentation in the substrate Wf. The first position and the second position may be specified based on the rotation angle of the substrate Wf, and the average of the first position and the second position may be indicated as the rotation angle of the substrate Wf. Since the substrate Wf is rotated in the two directions as described above, it is possible to detect the more accurate position of the indentation.

As described above, the indentation detecting system 430 detects the position of the indentation of the substrate Wf by measuring the physical quantity of the fluid which is the pressure or the flow rate. The pressure and the flow rate do not vary in accordance with an influence of slurry or water droplets used for the polishing process, and the pressure and the flow rate do not vary substantially in accordance with a detection environment. As a result, the indentation detecting system 430 may detect the accurate position of the indentation.

Figure 7:
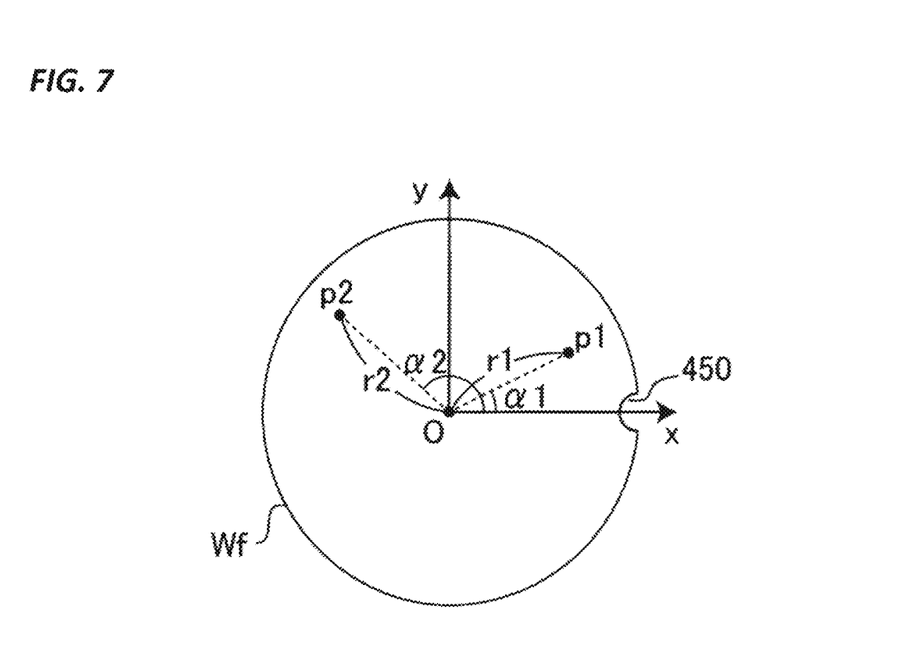
FIG. 7 is a schematic view illustrating coordinates of polishing points in a substrate to be selectively polished.

A series of processes performed by the partial polishing device 1000 configured as described above will be described with reference to FIG. 7 to FIGS. 13A to 13C. First, a distribution of the thicknesses of the film on the substrate Wf is measured by the surface condition detector 420. The surface condition detector 420 transmits information about the distribution of the thicknesses of the film to the control device 900. Based on the distribution of the thicknesses of the film, the control device 900 determines the position and the polishing amount of the polishing point (target region) to be selectively and partially polished. FIG. 7 is a schematic view illustrating the position of the polishing point on the surface of the substrate Wf. In the example illustrated in FIG. 7, there are two polishing points p1 and p2 at which the thicknesses of the film are greater than those at the other polishing points in the surface of the substrate Wf. Therefore, in this example, the polishing points p1 and p2 are the target regions to be selectively and partially polished.

The x-y coordinate system illustrated in FIG. 7 is an imaginary coordinate system defined on the surface of the substrate Wf and has an origin at the center O of the substrate Wf. The x axis of the x-y coordinate system is a line that runs through the center O of the substrate Wf and both sides with respect to the center of the indentation 450 in the substrate Wf, and the y axis of the x-y coordinate system is a line that runs through the center O of the substrate Wf and is perpendicular to the x axis.

The control device 900 determines a length r1 in the radial direction from the center O of the substrate Wf to the polishing point p1 and determines an angle α1 of the line connecting the center O and the polishing point p1 with respect to the x axis, and stores the length r1 and the angle α1, as information about the position of the polishing point p1, in a storage device (such as a memory) of the control device 900. Similarly, the control device 900 determines a length r2 in the radial direction from the origin O to the polishing point p2 and determines an angle α2 of the line connecting the center O and the polishing point p2 with respect to the x axis, and stores the length r2 and the angle α2, as information about the position of the polishing point p2, in the storage device of the control device 900. Based on the aforementioned position information and the information about the position of the indentation 450, the control device 900 determines an angle by which the substrate stage 400 is rotated and/or determines the movement amount of the processing head 500 in order to polish the polishing points p1 and p2.

Figure 8:
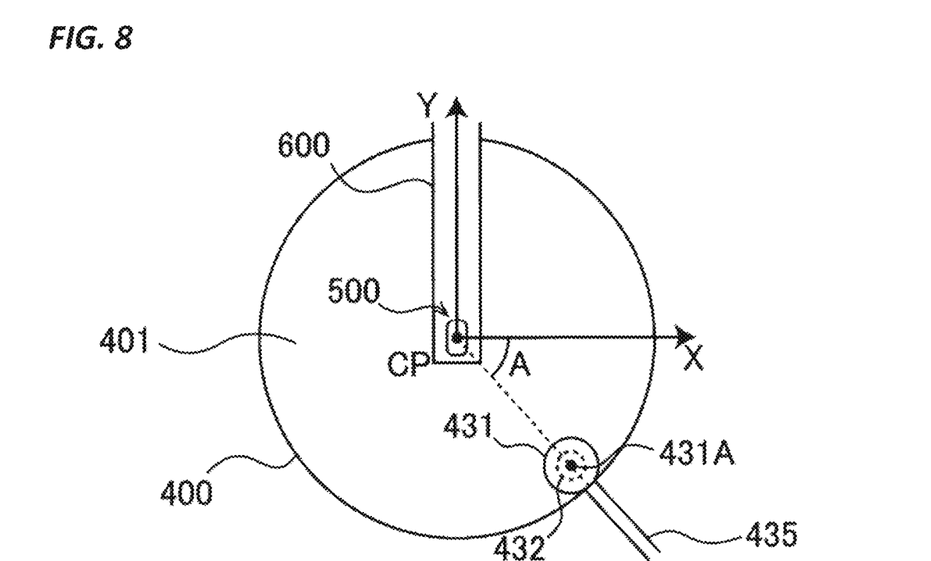
FIG. 8 is a top plan view illustrating a positional relationship between the fluid injection nozzle, a holding arm, and a substrate stage.

FIG. 8 is a top plan view illustrating a positional relationship between the fluid injection nozzle 431, the holding arm 600, and the substrate stage 400. A point at which the axial center 400A of the substrate stage 400 intersects the stage surface 401 is defined as an origin CP of the substrate stage 400. The X-Y coordinate system illustrated in FIG. 8 is an imaginary coordinate system defined on the stage surface 401 of the substrate stage 400 and has the origin CP. The X axis of the X-Y coordinate system is a horizontal line in the X direction of the partial polishing device 1000 which runs through the origin CP, and the Y axis of the X-Y coordinate system is a horizontal line which runs through the origin CP and is perpendicular to the X axis. The direction of the X axis, that is, the X direction of the partial polishing device 1000 is the movement direction of the processing head 500.

Figure 9:
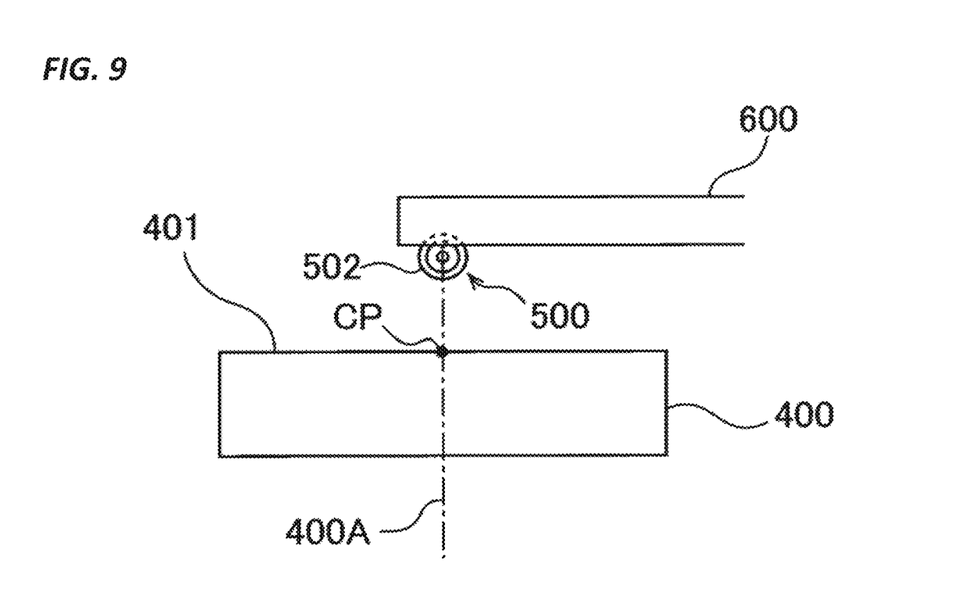
FIG. 9 is a view illustrating the processing head, the holding arm, and the substrate stage when viewed in an X-axis direction.

An angle A is an angle formed between the X axis and a line segment which extends from the origin CP and is perpendicular to the centerline 431A of the fluid injection nozzle 431. The angle A is measured in advance and then stored in the control device 900. The holding arm 600 is disposed along the Y axis. FIG. 9 is a view illustrating the processing head 500, the holding arm 600, and the substrate stage 400 when viewed in the X-axis direction. As illustrated in FIG. 9, the processing head 500 is disposed on the axial center 400A above the origin CP.

The processing head 500 and the fluid injection nozzle 431 are retracted to the outside of the substrate stage 400, and then the non-illustrated transport device loads the substrate Wf onto the upper ends of the four lift pins 402 (see FIG. 1). Thereafter, the four lift pins 402 are moved downward such that the substrate Wf is loaded onto the substrate stage 400. The positioning mechanism 404 (see FIG. 1) positions the substrate Wf such that the origin O of the substrate Wf and the origin CP of the substrate stage 400 coincide with each other. Further, the substrate Wf is fixed onto the stage surface 401 by vacuum suction or the like.

Figure 10:
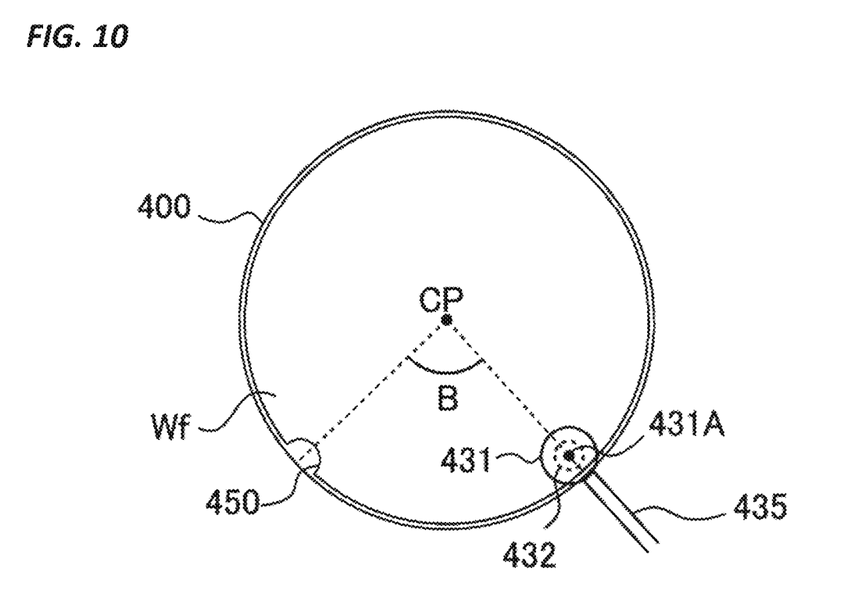
FIG. 10 is a top plan view schematically illustrating a positional relationship between the fluid injection nozzle and an indentation in the substrate when the substrate stage is positioned at a rotation origin.

After the substrate Wf is fixed onto the stage surface 401, the fluid injection nozzle 431 is moved to a position illustrated in FIG. 8. Thereafter, the substrate stage 400 is rotated to the rotation origin by the rotation mechanism 410 (see FIG. 1). The rotation origin of the substrate stage 400 means a reference point of the rotation angle of the substrate stage 400. FIG. 10 is a top plan view schematically illustrating a positional relationship between the indentation 450 in the substrate Wf and the fluid injection nozzle 431 when the substrate stage 400 is positioned at the rotation origin.

Next, the rotation mechanism 410 rotates the substrate stage 400 a predetermined number of times in a predetermined direction. The control device 900 simultaneously rotates the substrate stage 400 and starts the indentation detecting system 430. The indentation detecting system 430 detects the position of the indentation 450 through the aforementioned indentation detecting method. That is, the fluid is injected to the circumferential edge portion of the substrate Wf from the fluid injection nozzle 431 while the substrate Wf and the substrate stage 400 are rotated, and the position detector 440 detects the position of the indentation 450 based on a change in physical quantity (the pressure or the flow rate) of the fluid. The position detector 440 transmits a signal, which indicates the detected position of the indentation 450, to the control device 900. When the substrate Wf rotates a predetermined number of times, the rotation mechanism 410 stops the rotation of the substrate stage 400 and returns the substrate stage 400 back to the rotation origin thereof. The indentation detecting system 430 stops the injection of the fluid from the fluid injection nozzle 431.

As illustrated in FIG. 10, based on the position of the indentation 450, the control device 900 determines an angle B formed between a line segment connecting the origin CP and the indentation 450 and a line segment which extends from the origin CP and perpendicularly intersects the centerline 431A of the fluid injection nozzle 431, when the substrate stage 400 is positioned at the rotation origin.

Based on the angles A, B, α1, and α2, the control device 900 calculates the position (rotation angle) of the substrate stage 400 which is required for the target region (the polishing points p1 and p2) on the substrate Wf to reach a processing position of the processing head 500. The processing position of the processing head 500 is a position within the movement range in which the movement mechanism 620 illustrated in FIG. 1 may move the processing head 500, and in the present exemplary embodiment, the processing position of the processing head 500 is a position along the X axis illustrated in FIG. 8.

Figure 11:
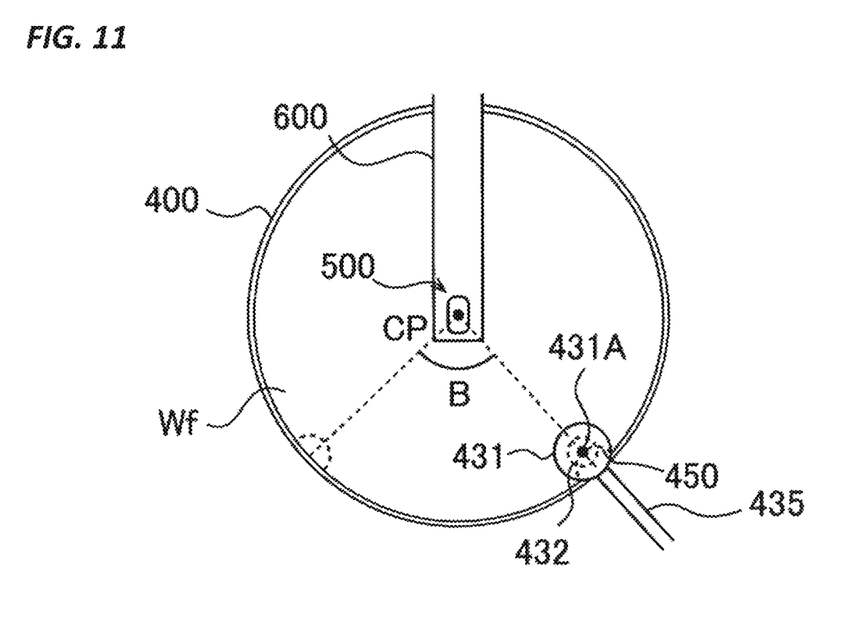
FIG. 11 is a view illustrating a state in which a center of the indentation in the substrate is moved to a nozzle center.
Figure 12:
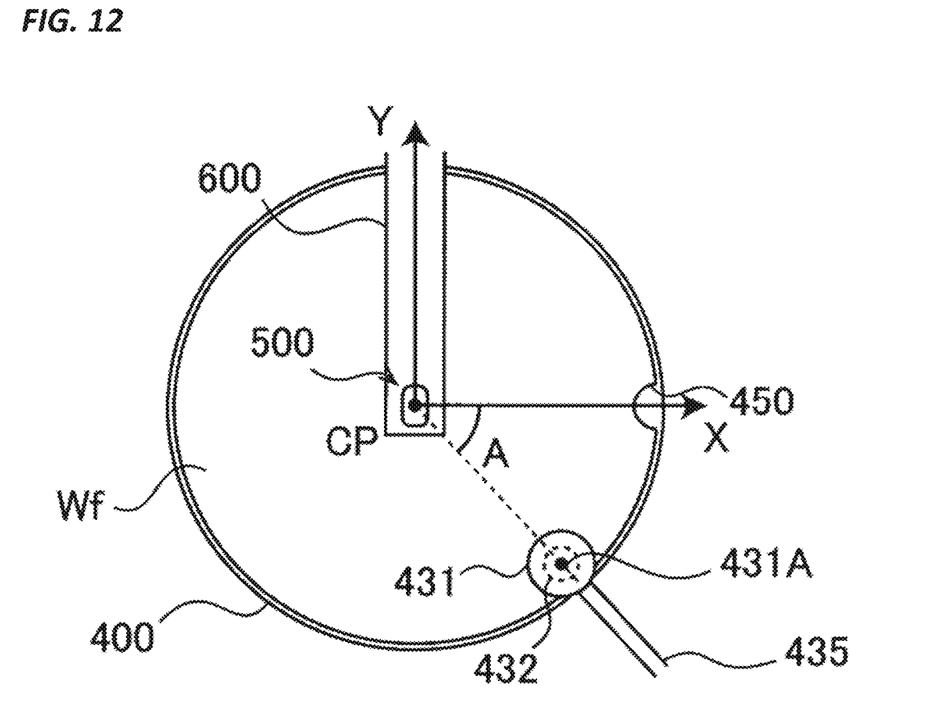
FIG. 12 is a view illustrating a state in which the substrate stage is rotated by an angle A by a rotation mechanism from the state illustrated in FIG. 11.

Next, as illustrated in FIG. 11, the processing head 500 is moved on the axis 400A of the substrate stage 400. The control device 900 commands the rotation mechanism 410 to rotate the substrate stage 400 by the angle B. Further, as illustrated in FIG. 12, the control device 900 commands the rotation mechanism 410 to rotate the substrate stage 400 by the angle A, thereby moving the indentation 450 on the X axis of the substrate stage 400. In this way, the x and y axes of the substrate Wf coincide with the X and Y axes of the substrate stage 400.

Figure 13A:
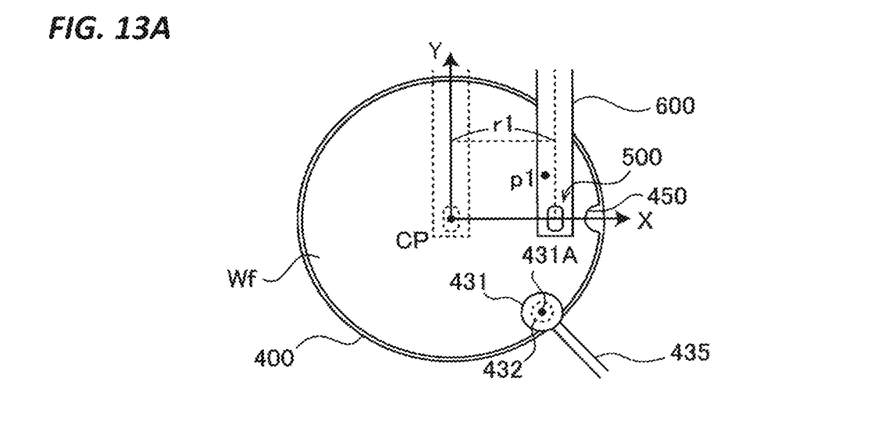
FIGS. 13A to 13C are schematic views illustrating in detail a method of polishing the polishing points.
Figure 13B:
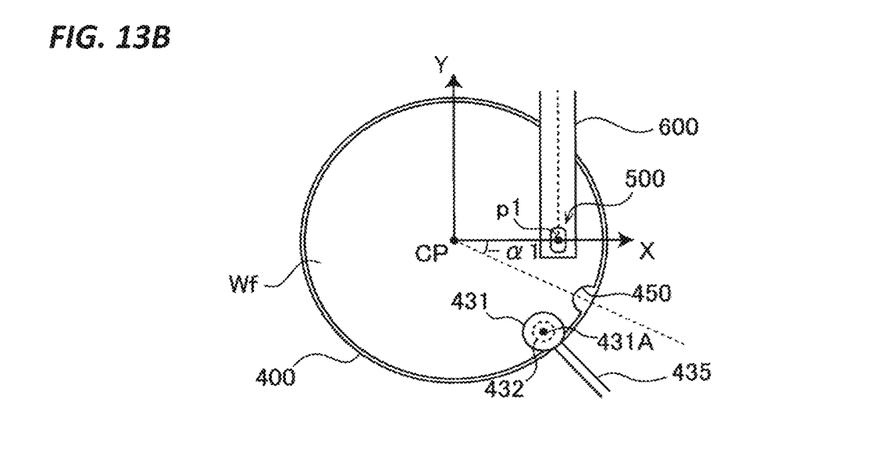
Figure 13C:
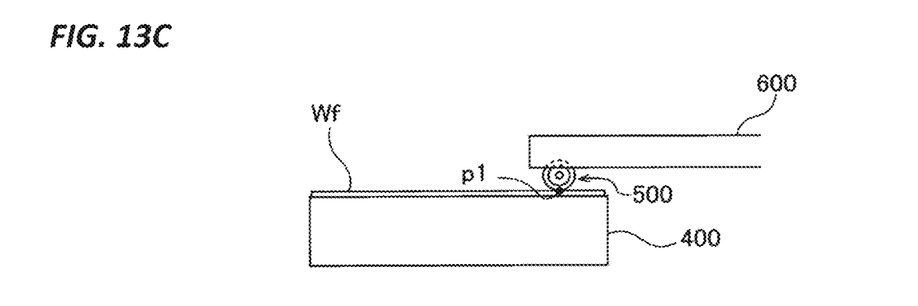

As described below, the polishing points p1 and p2 are sequentially polished. First, as illustrated in FIG. 13A, the movement mechanism 620 moves the processing head 500 by the distance r1. Next, as illustrated in FIG. 13B, the control device 900 rotates the substrate Wf by an angle of −α1 degrees using the rotation mechanism 410. Further, as illustrated in FIG. 13C, the control device 900 commands the vertical movement mechanism 602 to move the processing head 500 downward and bring the processing head 500 into slide contact with the surface of the substrate Wf, thereby polishing the surface of the substrate Wf.

After finishing the polishing, the control device 900 commands the vertical movement mechanism 602 to move the processing head 500 upward. Subsequently, in the order similar to the order described with reference to FIGS. 13A to 13C, the processing head 500 is moved by the distance of r2, the substrate Wf is rotated by an angle of −α2 degrees, and then the polishing point p2 is polished. After finishing the polishing, the substrate Wf may be cleaned at an arbitrary timing.

The substrate processing performed based on the method of detecting the indentation in the substrate Wf described in the aforementioned exemplary embodiment and based on information about the position of the indentation is not limited to the application to the partial polishing device. In one exemplary embodiment, the aforementioned indentation detecting method and the substrate processing may be applied to the buff processing apparatus (or buff polishing device) as disclosed in Japanese Patent Application Laid-Open No. 2016-074048. Further in one exemplary embodiment, the aforementioned indentation detecting method and the substrate processing may be applied to the notch polishing device disclosed in Japanese Patent Application Laid-Open No. 2009-028892. Further in one exemplary embodiment, the aforementioned indentation detecting method and the substrate processing may be applied to the pencil-type cleaning device disclosed in Japanese Patent Application Laid-Open No. 2015-023165. In the pencil-type cleaning device, a processing head 500 is a pencil-type cleaning tool that scrubs a surface of the substrate Wf.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate stage configured to hold a substrate on a surface of the substrate stage;
   a processing head configured to process a surface of the substrate;
   an indentation detecting system configured to detect a position of an indentation in the substrate;
   a movement motor configured to move the processing head in a radial direction of the substrate stage; and
   a rotation motor configured to rotate the substrate stage, wherein the indentation detecting system includes:
      a fluid injection nozzle having a tip directed vertically downward toward the surface of the substrate stage and configured to inject a fluid to a circumferential edge portion of the top surface of the substrate when the substrate is held on the surface of the substrate stage and rotated using the rotation motor;
      a fluid meter configured to measure a physical quantity which is pressure or a flow rate of the fluid; and
      a position detector configured to detect the position of the indentation formed in the circumferential edge portion of the substrate based on a change in physical quantity; wherein a direction of the tip of the fluid injection nozzle is perpendicular to the holding surface of the stage;
   wherein a first distance is between an axial center of the substrate stage and a centerline of the fluid injection nozzle and the first distance is smaller than a radius of the substrate.

2. The substrate processing apparatus of claim 1, wherein the position detector compares a difference between a newest measured value and a previously measured value of the physical quantity with a predetermined threshold value, and determines the position of the indentation based on a result of the comparison.

3. The substrate processing apparatus of claim 2, wherein the position detector determines the position of the indentation based on the rotation angle of the substrate stage when the difference reaches the threshold value.

4. The substrate processing apparatus of claim 1, wherein the position detector compares a measured value of the physical quantity with a predetermined threshold value, and determines the position of the indentation based on a result of the comparison.

5. The substrate processing apparatus of claim 4, wherein the position detector determines the position of the indentation based on the rotation angle of the substrate stage when the measured value of the physical quantity reaches the threshold value.

6. The substrate processing apparatus of claim 1, further comprising:
   a controller configured to calculate a position of the substrate stage, which is required for a target region on the substrate to reach a processing position of the processing head, based on the detected position of the indentation.

7. The substrate processing apparatus of claim 1, wherein the fluid is any one of pure water, clean air, and $N_2$ gas.

8. The substrate processing apparatus of claim 1, wherein the physical quantity is pressure of the fluid, and the fluid measuring device is a pressure sensor.

9. The substrate processing apparatus of claim 1, wherein the physical quantity is a flow rate of the fluid, and the fluid measuring device is a flow rate sensor.

10. The substrate processing apparatus of claim 1, wherein the processing head is a polishing head configured to polish the surface of the substrate.

11. The substrate processing apparatus of claim 1, wherein the processing head is a pencil-type cleaning tool configured to scrub the surface of the substrate.

12. The substrate processing apparatus of claim 1, wherein the first distance between the axial center of the substrate stage and the centerline of the fluid injection nozzle is equal to or greater than a second distance from the axial center of the substrate to an end of an innermost side of the indentation formed in the circumferential edge portion of the substrate.

13. A method of detecting comprising:
    holding a substrate on a surface of a substrate stage;
    injecting a fluid to a circumferential edge portion of a top surface of the substrate using a fluid injection nozzle having a tip directed vertically downward toward the surface of the substrate stage while rotating the substrate and the substrate stage using a rotation motor;
    measuring a physical quantity which is pressure or a flow rate of the fluid; and
    detecting a position of an indentation formed in a circumferential edge portion of the substrate based on a change in physical quantity; wherein a direction of the tip of the fluid injection nozzle is perpendicular to the holding surface of the stage;
    wherein a first distance is between an axial center of the substrate stage and a centerline of the fluid injection nozzle and the first distance is smaller than a radius of the substrate.

14. The method of claim 13, wherein the detecting the position of the indentation based on the change in physical quantity includes comparing a difference between a newest measured value and a previously measured value of the physical quantity with a predetermined threshold value, and determining the position of the indentation based on a result of the comparison.

15. The method of claim 14, wherein the determining the position of the indentation based on the comparison result includes determining the position of the indentation based on a rotation angle of the substrate stage when the difference reaches the threshold value.

16. The method of claim 13, wherein the detecting the position of the indentation based on the change in physical quantity includes comparing a measured value of the physical quantity with a predetermined threshold value, and determining the position of the indentation based on a result of the comparison.

17. The method of claim 16, wherein the determining the position of the indentation based on the comparison result includes determining the position of the indentation based on a rotation angle of the substrate stage when the measured value of the physical quantity reaches the threshold value.

18. A method of detecting comprising:
   holding a substrate on a substrate stage;
   injecting a fluid to a circumferential edge portion of the substrate while rotating the substrate and the substrate stage;
   measuring a physical quantity which is pressure or a flow rate of the fluid; and
   detecting a position of an indentation formed in a circumferential edge portion of the substrate based on a change in physical quantity,
   wherein the injecting the fluid to the circumferential edge portion of the substrate while rotating the substrate and the substrate stage includes injecting the fluid to the circumferential edge portion of the substrate while rotating the substrate and the substrate stage in a first direction and a second direction opposite to the first direction, and
   the detecting the position of the indentation based on the change in physical quantity includes detecting a first position of the indentation formed in the circumferential edge portion of the substrate based on the change in physical quantity when the substrate and the substrate stage are rotated in the first direction, detecting a second position of the indentation based on the change in physical quantity when the substrate and the substrate stage are rotated in the second direction, and determining the position of the indentation which is an average of the first position and the second position.

* * * * *